United States Patent [19]
Kim et al.

[11] Patent Number: 5,642,309
[45] Date of Patent: Jun. 24, 1997

[54] AUTO-PROGRAM CIRCUIT IN A NONVOLATILE SEMICONDUCTOR MEMORY DEVICE

[75] Inventors: Jin-Ki Kim; Hyung-Kyu Lim; Sung-Soo Lee, all of Seoul, Rep. of Korea

[73] Assignee: Samsung Electronics Co., Ltd., Suwon, Rep. of Korea

[21] Appl. No.: 526,422

[22] Filed: Sep. 11, 1995

[30] Foreign Application Priority Data

Sep. 9, 1994 [KR] Rep. of Korea ................ 22769/1994
Jan. 24, 1995 [KR] Rep. of Korea ................ 1144/1995

[51] Int. Cl.$^6$ ................................ G11C 7/00; G11C 16/04
[52] U.S. Cl. ........................... 365/185.22; 365/185.2; 365/189.07; 365/189.09
[58] Field of Search .................... 365/189.01, 185.01, 365/182, 218

[56] References Cited

U.S. PATENT DOCUMENTS

| | | | |
|---|---|---|---|
| 5,291,446 | 3/1994 | Van Buskirk et al. | 365/189.09 |
| 5,379,256 | 1/1995 | Tanaka et al. | 365/185 |
| 5,386,422 | 1/1995 | Endoh et al. | 371/21.5 |
| 5,396,468 | 3/1995 | Harari et al. | 365/218 |
| 5,428,569 | 6/1995 | Kato et al. | 365/189.01 |
| 5,434,825 | 7/1995 | Harari | 365/185 |
| 5,450,341 | 9/1995 | Sawada et al. | 365/185 |

*Primary Examiner*—Viet Q. Nguyen
*Attorney, Agent, or Firm*—Cushman Darby & Cushman, IP Group of Pillsbury Madison & Sutro LLP

[57] ABSTRACT

An auto-program voltage generator in a nonvolatile semiconductor memory having a plurality of floating gate type memory cells, program circuit for programming selected memory cells, and program verification circuit for verifying whether or not the selected memory cells are successfully programmed comprises a high voltage generator for generating a program voltage, a trimming circuit for detecting the level of the program voltage to increase sequentially the program voltage within a predetermined voltage range every time the selected memory cells are not successfully programmed, a comparing circuit for comparing the detected voltage level with a reference voltage and then generating a comparing signal, and a high voltage generation control circuit for activating the high voltage generator in response to the comparing signal.

19 Claims, 10 Drawing Sheets

AUTO-PROGRAM CIRCUIT IN A NONVOLATILE SEMICONDUCTOR MEMORY DEVICE

BACKGROUND OF THE INVENTION

1. Field of the Invention

The present invention relates to a nonvolatile semiconductor memory device, and more particularly to an auto-program circuit in the nonvolatile semiconductor memory device.

2. Description of the Related Arts

A memory cell array with NAND structured cells has a plurality of NAND cell units arranged in a matrix with columns and rows. FIG. 9 is an equivalent circuit diagram showing a part of the memory cell array with conventional NAND structured cells. Referring to the figure, each of the NAND cell units NU1 to NUm has a first selection transistor 120 with its drain connected to the corresponding bit line and a second selection transistor 121 with its source connected to a common source line CSL. The drain-source channels of memory cell transistors M1 to M8 (hereinafter referred to as "memory cells") are serially connected between a source of the first selection transistor 120 and a drain of the second selection transistor 121. The gates of the first selection transistors 120, the control gates of the memory cells M1 to M8 and the gates of the second selection transistors 121 are connected to a first selection line SL1, word lines WL1 to WL8 and a second selection line SL2, respectively. The first and second selection transistors 120 and 121 and the memory cells M1 to M8 are formed in the P type well formed on the main surface of a semiconductor substrate. The source-drain common region between the source of the first selection transistor 120 and the drain of the memory cell M1, the source-drain common regions of the memory cells M1 to M8, and the drain-source common region between the drain of the second selection transistor 121 and the source of the memory cell M8 are formed in the P type well. A floating gate made of polysilicon is formed on each channel of the memory cells M1 to M8 through a tunnel oxide layer, and a floating gate made of polysilicon or of metal silicide with high melting point is formed thereon through an intermediate insulating layer. The drain regions of the first selection transistors 120 formed in the P type well are respectively connected to the corresponding bit lines made of metal silicide with high melting point or metal through openings, the source regions of the second selection transistors 121 formed in the P type well are connected to the common source line CSL made of the metal silicide with high melting point or metal. The erase operation for the memory cells is performed before programming, i.e., writing data.

The erase operation for the memory cells is performed by applying erase voltage of about 20 V to the P type well region and reference voltage, i.e., ground voltage to the word lines WL1 to WL8. With the electrons stored in the floating gates being emitted to the P type well region through the tunnel oxide layer, the memory cells are changed to enhancement mode transistors. It can be assumed that the erased memory cells store the data "1".

The programming operation for the memory cells connected to the selected word line, i.e., the writing operation of the data "0" is performed by applying program voltage of about 18 V to the selected word line and the reference voltage, i.e., the ground voltage Vss to the sources and drains of the memory cells in which the data "0" is written. Then, the floating gates of the memory cells to be programmed accumulate the electrons thorough the tunnel oxide layers, and these memory cells are changed to the depletion mode transistors.

After programming, the program verification operation is performed to verify whether or not the selected memory cells are successfully programmed to have a predetermined constant threshold voltage value. These erase, program and program verification techniques are disclosed in the Korean Patent Publication No. 94-18870 published Aug. 19, 1994 and assigned to the present inventor.

As the capacitance of the EEPROM has become highly integrated, the size of the memory cell, such as the width and thickness of the gate oxide layer and the width and length of the channel region, has been reduced. However, variance of the manufacturing process can not secure the uniformity of the width and thickness of the gate oxide layer, intermediate insulating layer and channel region. This makes the threshold voltage values of the programmed memory cells unequal. If at least one of the programmed memory cells does not reach a desired threshold voltage, error data is read out. In order to solve such a problem, a program verification device has been proposed for verifying whether or not the selected memory cells are successfully programmed. For example, such a program verification technique is disclosed in the aforementioned Korean Patent Publication No. 94-18870. However, as the reprogram operation is performed after the program verification operation with a program voltage of constant level, the threshold voltages of the programmed memory cells are still unequal. The variance of the circumstance conditions such as a power supply voltage or an operating temperature may deteriorate the reliability of the EEPROM.

SUMMARY OF THE INVENTION

It is therefore an object of the present invention to provide a nonvolatile semiconductor memory capable of maintaining a uniform threshold voltage of the memory cells to be programmed regardless of the variance of the operating temperature and power supply voltage.

It is another object of the present invention to provide the nonvolatile semiconductor memory capable of enhancing the reliability thereof regardless of the variance of the process.

To achieve the above objects of the present invention, an auto-program voltage generator of the nonvolatile semiconductor memory having a plurality of floating gate type memory cells, a program circuit for programming the selected memory cells, and a program verification circuit for verifying whether or not the selected memory cells are successfully programmed, comprises a high voltage generator for generating a program voltage, a trimming circuit for detecting the level of the program voltage so as to sequentially increase the program voltage within a predetermined voltage range every time the selected memory cells are not successfully programmed, a comparing circuit for comparing the detected voltage level with a reference voltage and then generating a comparing signal, and a high voltage generation control circuit for activating the high voltage generator in response to the comparing signal.

BRIEF DESCRIPTION OF THE DRAWINGS

In the detailed description of the preferred embodiment of the present invention presented below, reference is made to the accompanying drawings, in which.

DETAILED DESCRIPTION OF THE PREFERRED EMBODIMENT

N-channel transistors of depletion mode (hereinafter referred to as "D type transistors") having a threshold voltage of $-1.8$ V, N-channel MOS transistors of enhancement mode (hereinafter referred to as "N type transistors") having the threshold voltage of $0.7$ V, and P-channel MOS transistors (hereinafter referred to as "P type transistors") having the threshold voltage of $-0.9$ V are employed in the present invention.

Figure 1:
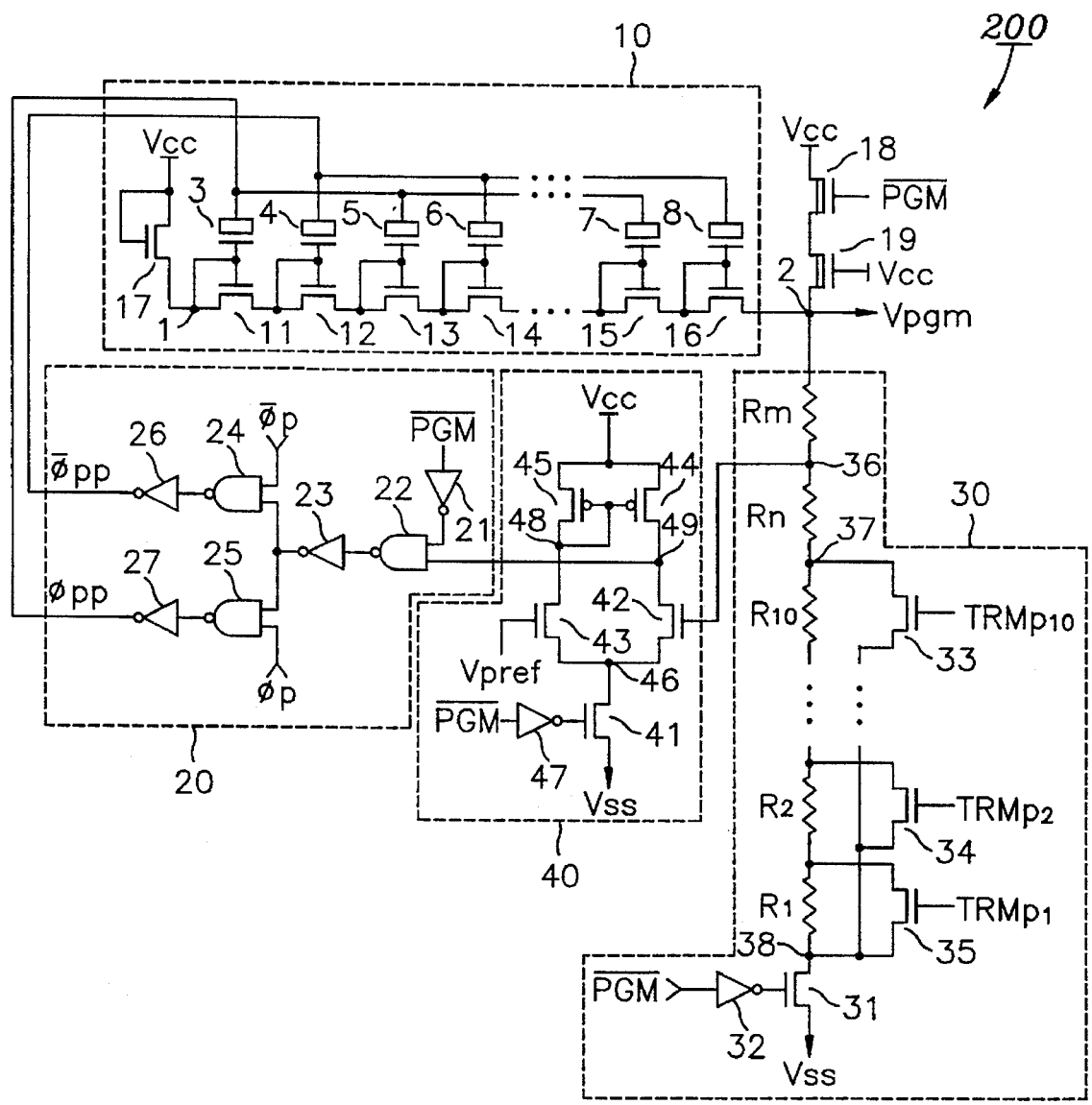
FIG. 1 is a diagram illustrating a program voltage generator according to a preferred embodiment of the present invention.

FIG. 1 illustrates a program voltage generator 200. In the figure, a high voltage generator 10 functions to generate a program voltage Vpgm in response to a charge pumping signal $\phi pp$ and its complementary signal $\overline{\phi pp}$ outputted from a high voltage generation control circuit 20. The high voltage generator 10 is a well-known circuit for generating the program voltage Vpgm higher than the power supply voltage Vcc by utilizing a charge pumping method. The high voltage generator 10 comprises an N type transistor 17 for providing an initial voltage Vcc-Vth to a node 1, N type transistors 11 to 16 having their own channels serially connected between the node 1 and an output node 2, and MOS capacitors 3 to 8 respectively connected to the gates of the N type transistors 11 to 16. The gates of the N type transistors 11 to 16 are respectively connected to their drains, and the drain-source common nodes of odd MOS capacitors 3, 5, and 7 and the drain-source common nodes of even MOS capacitors 4, 6, and 8 are connected to the charge pumping signal $\phi pp$ and its complementary signal $\overline{\phi pp}$, respectively.

The channels of the D type transistors 18 and 19 are serially connected between the output node 2 of the high voltage generator 10 and the power supply voltage Vcc, and the gates thereof are respectively connected to a program control signal $\overline{PGM}$ and the power supply voltage Vcc. At the completion of the program operation, the D type transistors 18 and 19 function to discharge the program voltage Vpgm to the power supply voltage Vcc.

A trimming circuit 30 for sequentially increasing the program voltage Vpgm during the program operation is connected to the output node 2. Between the ground voltage Vss and the output node 2 is connected the trimming circuit 30 in which the channel of an N type transistor 31 and the resistors $R_1$ to $R_{10}$, $R_n$ and $R_m$ are serially connected one another and the gate of the N type transistor 31 is connected to the program control signal $\overline{PGM}$ through an inverter 32. A connection node 37 between the resistors $R_n$ and $R_{10}$ is connected to a connection node 38 between the resistor $R_1$ and the drain of the N type transistor 31 through the channel of an N type transistor 33. The connection nodes between the resistors $R_{10}$ to $R_1$ are respectively connected to the connection node 38 through the channels of the transistors 34 and 35. The gates of the transistors 33 to 35 are respectively connected to the trimming signals $TRM_{P1}$ to $TRM_{P10}$. The transistors 33 to 35 are bypass means for bypassing the resistors $R_1$ to $R_{10}$, sequentially.

A comparing circuit 40 functions to compare the reference voltage Vpref with the voltage $V_{36}$ of the connection node 36 between the resistors $R_m$ and $R_n$. In the comparing circuit 40, the channel of a transistor 41 is connected between the ground voltage Vss and a common node 46, and the gate thereof is connected to the program control signal $\overline{PGM}$ through an inverter 47. A first branch in which the channels of the P type transistor 44 and N type transistor 42 are serially connected and a second branch in which the channels of the P type transistor 45 and N type transistor 43 are serially connected are connected in parallel between the power supply voltage Vcc and the common node 46. The gates of the P type transistors 44 and 45 are commonly connected each other and are also connected to a connection node 48 between the P type transistor 45 and the N type transistor 43. The reference voltage Vpref, i.e., about $1.67$ V is applied to the gate of the N type transistor 43. The gate of the N type transistor 42 is connected to the common node 36. The connection node 49 between the P type transistor 44 and the N type transistor 42 serves as an output terminal of the comparing circuit 40. The comparing circuit 40 outputs the logic "low" state if the voltage $V_{36}$>the reference voltage Vpref, and outputs the logic "high" state if $V_{36}$<Vpref.

The high voltage generation control circuit 20 is connected between the comparing circuit 40 and the high voltage generator 10 and functions to control the program voltage Vpgm to maintain a predetermined constant voltage level. The high voltage generation control circuit 20 comprises a NAND gate 22 having one input connected to the connection node 49 and the other connected to the program control signal $\overline{PGM}$ through an inverter 21. The first inputs of the NAND gates 24 and 25 receive the output of the NAND gate 22 through an inverter 23, and the second inputs thereof respectively receive the clock pulses $\overline{\phi p}$ and $\phi p$ from a ring oscillator (not shown). At this time, the clock pulses $\overline{\phi p}$ and $\phi p$ have the frequency of about 8 MHz. The NAND gates 24 and 25 output the charge pumping signals $\overline{\phi pp}$ and $\phi pp$ through inverters 26 and 27.

If $V_{36}$>Vpref, the high voltage generation control circuit 20 is inactivated, and if $V_{36}$<Vpref, it becomes activated. Thus, if the program voltage Vpgm increases, the voltage $V_{36}$ also increases. Therefore, the high voltage generation control circuit 20 is inactivated and thus the high voltage generator 10 reduces the program voltage Vpgm. On the other hand, if the program voltage Vpgm is too low, the high voltage generator 10 increases the program voltage Vpgm. Hence, the program voltage Vpgm maintains a constant voltage level by the control of the high voltage generation control circuit 20.

At the turn off state of the transistors 33 to 35, the initial program voltage Vpgmin on the output node 2 can be represented as follows:

$$Vpgmin = Vpref\left(1 + \frac{R_m}{R_1 + R_2 + \ldots + R_{10} + R_n + R_m}\right). \quad (1)$$

At the turn on state of the transistor 35, the program voltage $V_{pgm1}$ on the output node 2 can be represented as follows:

$$V_{pgm1} = Vpref\left(1 + \frac{R_m}{R_2 + \ldots + R_{10} + R_n + R_m}\right). \quad (2)$$

At the turn on state of the transistor 34, the program voltage $V_{pgm2}$ on the output node 2 can be represented as follows:

$$V_{pgm2} = Vpref\left(1 + \frac{R_m}{R_3 + \ldots + R_{10} + R_n + R_m}\right). \quad (3)$$

As can be seen from the above equations, when the transistors 35 to 33 are sequentially turned on, the program voltage on the output node 2 are sequentially increased. Accordingly, by sequentially performing the program and program verification operations with increasing the program voltage sequentially within a predetermined voltage range, i.e., from 15 V to 19.5 V, the memory cells having constant threshold voltages regardless of various changes such as the change of the process and the change of the circumstance conditions can be implemented.

Figure 2:
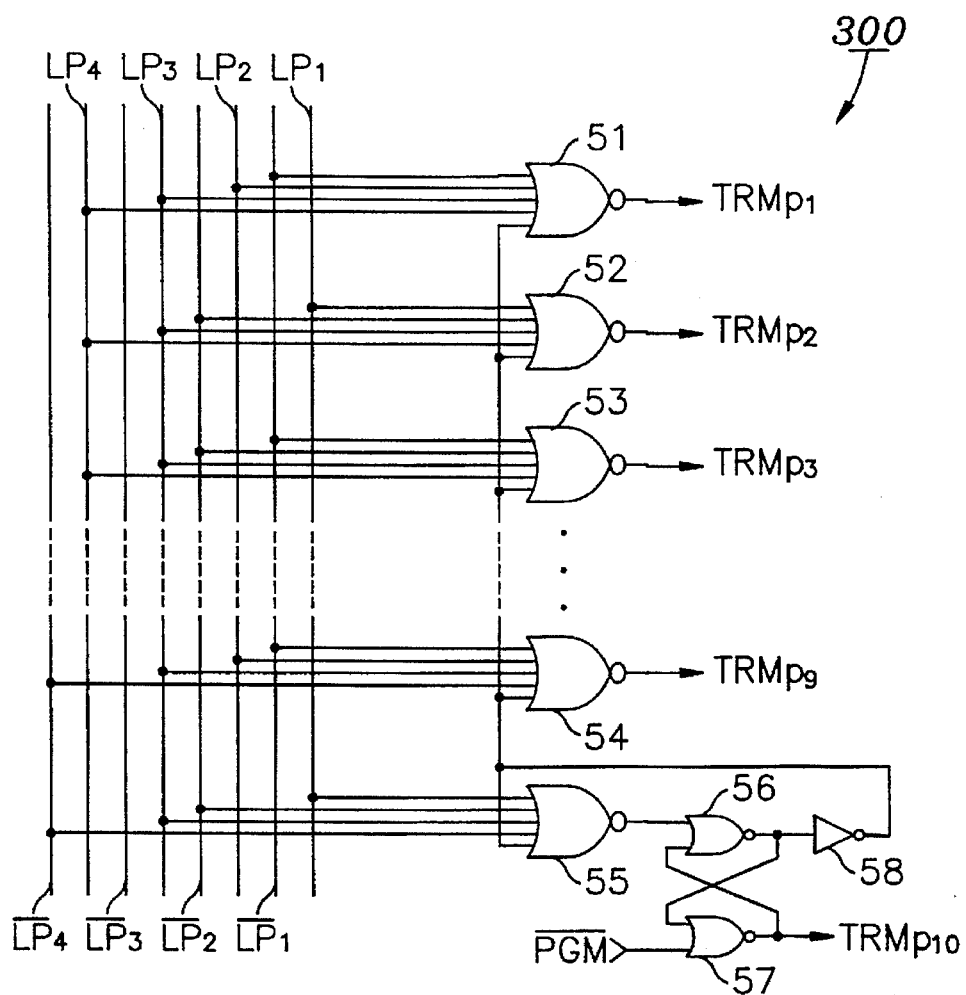
FIG. 2 is a diagram illustrating a trimming signal generator according to the preferred embodiment of the present invention.

FIG. 2 is a trimming signal generator 300 for generating trimming signals which sequentially increase the program voltage Vpgm with sequentially turning on the transistors 35 to 33 in FIG. 1. The trimming signal generator 300 has a plurality of NOR gates 51 to 55 which receive the combinations of the output signals $LP_1$ to $LP_4$ of a binary counter and their complementary signals $\overline{LP_1}$ to $\overline{LP_4}$. The output of the NOR gate 55 is coupled to one input of a NOR gate 56 in a flip-flop. The output of the NOR gate 56 is applied to the NOR gates 51 to 55 through an inverter 58, and also to one input of a NOR gate 57. The other input of the NOR gate 57 in the flip-flop is coupled to the program control signal $\overline{PGM}$, and the output thereof is connected to the trimming signal $TRM_{P10}$ and also to the other input of the NOR gate 56. During the program operation, the flip-flop composed of the NOR gates 56 and 57 latches the trimming signal $TRM_{P10}$ to the logic "high" state if the NOR gate 55 is selected, i.e., the NOR gate 55 outputs the logic "high" state. The inverter 58 provides the output of the NOR gate 56 as a feedback signal. Thus, the NOR gates 56 and 57 and the inverter 58 are latch means for latching the trimming signals $TRM_{P1}$ to $TRM_{P10}$ to the logic "low" state. Therefore, if the selected memory cell is not successfully programmed even after the completion of the tenth program verification operation, the program operations thereafter maintain the increased maximum program voltage Vpgmmax level, i.e., 19.5 V according to the preferred embodiment of the present invention. As the maximum program voltage Vpgmmax is selected as the value capable of preventing the junction break down and the break down of the gate oxide layer of the memory cell, it should be noted that the present invention is not limited to the maximum program voltage level of 19.5 V. In addition, the present invention employs 10 trimming signals, however, it is not limited thereto, either. However, it is desired that the program voltage $\Delta v$ to be increased every program operation should be below 1 V, preferably below 0.5 V.

Figure 3A:
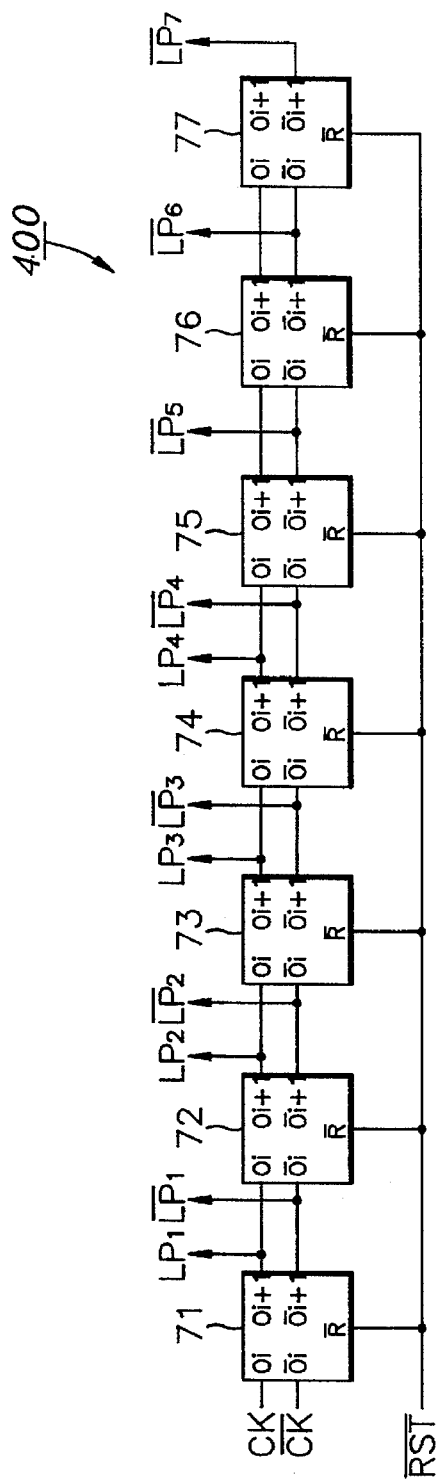
FIG. 3A is a diagram illustrating a binary counter according to the preferred embodiment of the present invention.
Figure 3B:
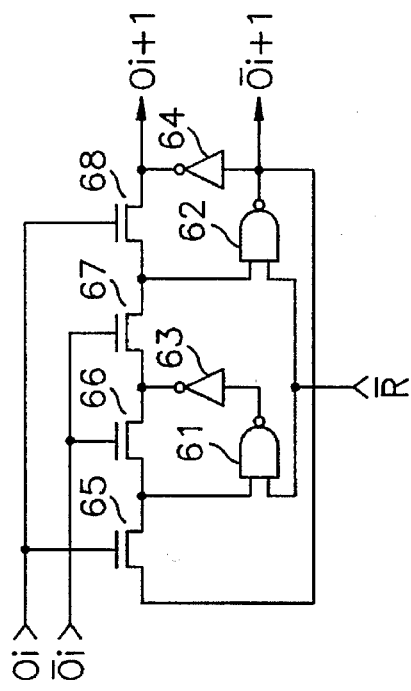
FIG. 3B is a diagram illustrating each stage in the binary counter of FIG. 3A.

FIG. 3A shows the binary counter and FIG. 3B a schematic circuit diagram of each stage in the binary counter of FIG. 3A.

Referring to FIG. 3B, the channels of N type transistors 65 to 68 are serially connected between an output terminal oi+1 and its complementary output terminal $\overline{o}$i+1, the gates of the transistors 66 and 67 are commonly connected to a complementary clock input terminal $\overline{o}$i, and the gates of the transistors 65 and 68 to the clock input terminal oi. An inverter 64 is connected between the output terminal oi+1 and its complementary output terminal $\overline{o}$i+1, a second input of a NAND gate 61 is coupled to a connection node between the transistors 65 and 66, and the output thereof to a connection node between the transistors 66 and 67 through an inverter 63. A second input of the NAND gate 62 is coupled to a connection node between the transistors 67 and 68, and the output thereof to the complementary output terminal $\overline{o}$i+1. Thus, if the reset signal of logic "low" state is applied to a reset terminal $\overline{R}$, the output terminal oi+3 becomes the logic "low" state and its complementary output terminal $\overline{o}$i+1 becomes the logic "high" state. In addition, every time the input of the input terminal oi goes from the logic "high" state to the logic "low" state, the output state of the output terminal oi+1 is changed.

The binary counter 400 of FIG. 3A is composed of 7 stages serially connected one another. The reset terminal $\overline{R}$ is coupled to the reset signal $\overline{RST}$, and the clock input terminal oi and its complementary clock input terminal $\overline{o}$i at the first stage are respectively connected to the clock signal CK and its complementary clock signal $\overline{CK}$. The 7 stages 71 to 77 output complementary counting signals $\overline{LP_1}$ to $\overline{LP_7}$, and the 4 stages 71 to 74 output the counting signals $LP_1$ to $LP_4$. Every time the clock signal CK goes to the logic "low" state, the counting signals $LP_1$ to $LP_4$ are counted up and the complementary counting signals $\overline{LP_1}$ to $\overline{LP_7}$ are counted down.

Figure 4:
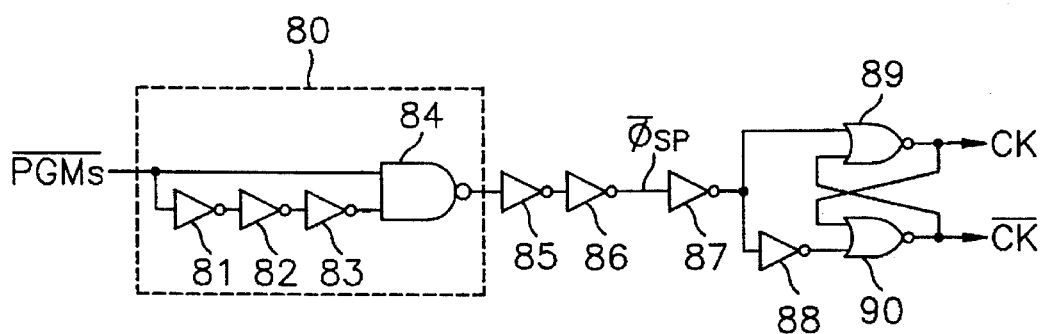
FIG. 4 is illustrates a clock signal generator for generating a clock signal for driving the binary counter of FIG. 3A.

FIG. 4 is a circuit diagram showing a clock signal generator for generating the clock signal to be provided to the binary counter 400 of FIG. 3A. In the figure, a program and verification signal $\overline{PGMs}$ is generated from a timer (not shown) in response to the program control signal $\overline{PGM}$. The clock signal generator comprises a short pulse generator 80 composed of inverters 81 to 83 and a NAND gate 84, inverters 85 to 88, and NOR gates 89 and 90. The NOR gates 89 and 90 are comprised in a flip-flop. The short pulse generator 80 generates the short pulse of logic "low" state when the program and verification signal $\overline{PGMs}$ goes to the logic "high" state.

Figure 5:
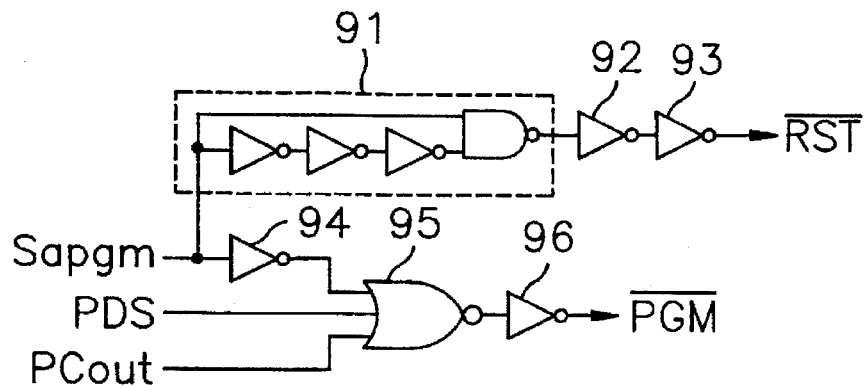
FIG. 5 is a diagram illustrating a control signal generator according to the preferred embodiment of the present invention.

FIG. 5 is a schematic circuit diagram of a control signal generator for generating the reset signal $\overline{RST}$ and the program control signal $\overline{PGM}$. The control signal generator of FIG. 5 generates the reset signal $\overline{RST}$ through a short pulse generator 91 and inverters 92 and 93 in response to an auto-program flag signal Sapgm outputted from a command register (not shown). The auto-program flag signal Sapgm is applied to a first input of a NOR gate 95 through an inverter 94, a program detection signal PDS to a second input thereof and a loop counting signal PCout to a third input thereof. The NOR gate 95 outputs the program control signal $\overline{PGM}$ through an inverter 96. The program detection signal PDS is generated according to the program verification operation. If all the selected memory cells have been successfully programmed, the program detection signal PDS becomes the logic "high" state. On the contrary, if at least one of the selected memory cells has not been successfully programmed, the program detection signal PDS becomes the logic "low" state. Such a program verification technique is disclosed in the aforementioned Korean Patent Publication No. 94-18870.

Figure 6:
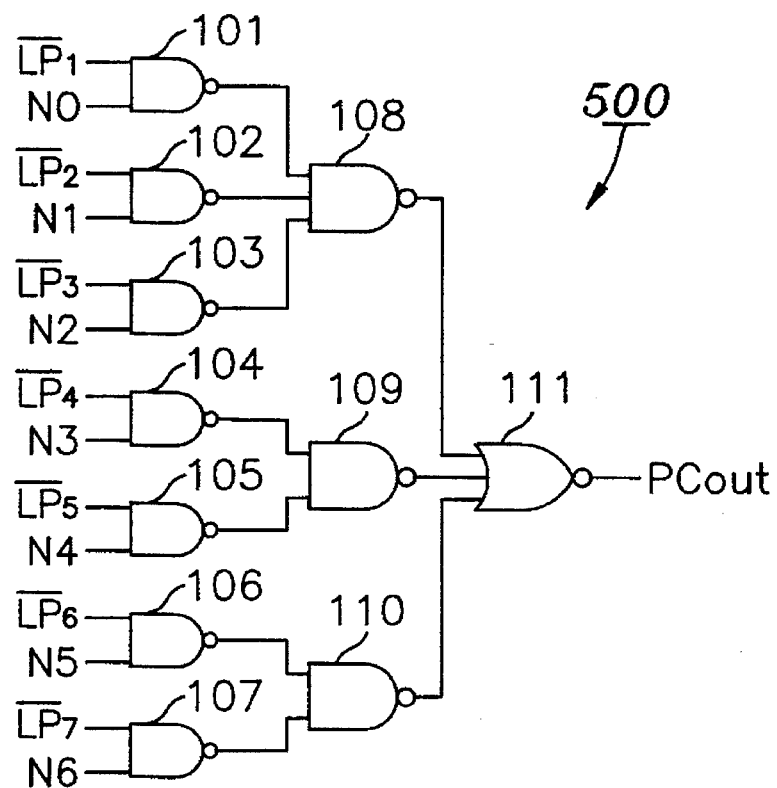
FIG. 6 is a diagram illustrating a loop counter according to the preferred embodiment of the present invention.

FIG. 6 shows a loop counting circuit 500 for generating the loop counting signal PCout. The loop counting circuit 500 is a logic circuit composed of NAND gates 101 to 110 and a NOR gate 111. The complementary counting signals $\overline{LP_1}$ to $\overline{LP_7}$ are applied from the binary counter 400 to the NAND gates 101 to 107, respectively. The terminals N0 to N6 are connected to the ground voltage Vss or to the power supply voltage Vcc according to the loop counting frequency. As the loop counting frequency is set to 20 according to the preferred embodiment of the present invention, the terminals N2 and N5 are connected to the power supply voltage Vcc, and the remaining terminals N0, N1, N3, N4, and N6 are connected to the ground voltage Vss.

The auto-program circuit according to the preferred embodiment will be described with reference to the timing diagram of FIG. 7.

Figure 7:
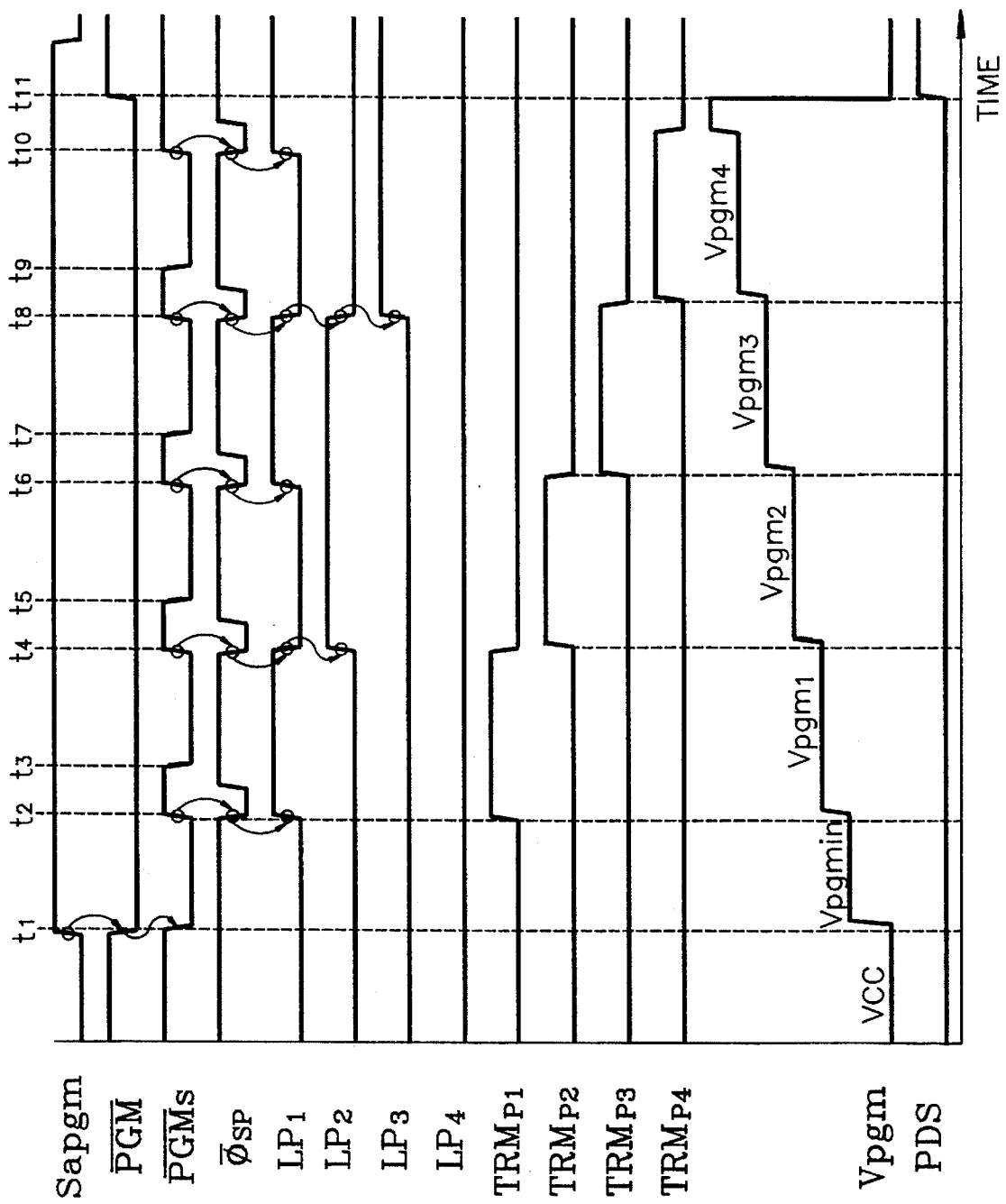
FIG. 7 is a timing diagram showing the operations of each part of the circuits related to the program voltage generator according to the preferred embodiment of the present invention.

As shown in FIG. 7, the auto-program operation starts in response to the transition of the auto-program flag signal Sapgm from the logic "low" state to the logic "high" state. As the program detection signal PDS and the loop counting signal PCout are in the logic "low" state at the beginning of the auto-program operation, the control signal generator generates the program control signal $\overline{PGM}$ of logic "low" state in response to the transition of the auto-program flag signal Sapgm from the logic "low" state In the logic "high" state. In addition, in response to the auto-program flag signal Sapgm which goes to the logic "high" state, the short pulse generator 91 generates the short pulse of logic "low" state and thereby the binary counter 400 of FIG. 3A is reset. As shown in FIG. 7, the timer (not shown) generates the program and verification signal $\overline{PGMs}$ in response to the transition of the program control signal from the logic "high" state to the logic "low" state. The program and verification signal $\overline{PGMs}$ is the clock pulse which has the logic "low" state of 30 μsec and the logic "high" state of 10 μsec when the program control signal $\overline{PGM}$ is in the logic "low". The duration when the program control signal remains the logic "low" state is for the program operation, and the duration when the program control signal remains the logic "high" state is for the program verification operation.

At time $t_1$ of FIG. 7, in response to the transition of the program control signal $\overline{PGM}$ from the logic "high" state to the logic "low" state, the program voltage generator 200 of FIG. 1 is enabled. That is, the transistor 41 is turned on, thus activating the comparing circuit 40, and the transistor 31 is turned on, thus activating the trimming circuit 30. At the beginning of the operation, as Vpref>$V_{36}$, the comparing circuit 40 outputs the logic "high" state. Hence, the inverter 23 outputs the logic "high" state and thereby the high voltage generation control circuit 20 generates the charge pumping signal φpp and its complementary signal $\overline{φpp}$. Thus, the high voltage generator 10 generates the gradually increasing high voltage by the signals φpp and $\overline{φpp}$. The program voltage Vpgm increases until the voltage $V_{36}$ at the connection node 36 reaches the reference voltage Vpref. Consequentially, the program voltage Vpgm maintains the initial program voltage Vpgmin shown in the above-described equation (1). The technique for programming the selected memory cells with the program voltage Vpgm is disclosed in the Korean Patent Publication No. 94-18870.

At time $t_2$, the program and verification signal $\overline{PGMs}$ goes to the logic "high" state, and the program verification operation for the programmed memory cells is performed during the time between $t_1$ and $t_2$. In response to the program and verification signal $\overline{PGMs}$ which goes to the logic "high" state at time $t_2$, the short pulse generator 80 of FIG. 4 generates the short pulse and the inverter 86 generates the short pulse signal $\overline{φsp}$ of logic "low" state. The clock signal CK is generated as a similar signal to the short pulse signal $\overline{φsp}$. Then, the binary counter 400 of FIG. 3A makes the counting signal $LP_1$ the logic "high" state as shown in FIG. 7. Thereby, the NOR gate 51 of FIG. 2 generates the trimming signal $TRM_{P1}$ of logic "high" state. Thus, with the turn on state of the transistor 35 of FIG. 1, the resistor $R_1$ is bypassed, and the voltage $V_{36}$ at the connection node 36 becomes smaller than the reference voltage Vpref. As a result, the high voltage generation control circuit 20 is activated and the high voltage generator 10 generates the increased program voltage $V_{pgm1}$ as shown in the above equation (2).

If the selected memory cells are not successfully programmed during the program verification operation between the time $t_2$ and $t_3$, i.e., the duration of 10 μsec, reprogram operation is automatically performed with the increased program voltage $V_{pgm1}$ during the time between $t_3$ and $t_4$.

At time $t_4$, if the program and verification signal $\overline{PGMs}$ goes to the logic "high" state, the short pulse generator 80 of FIG. 4 generates the short pulse of logic "low" state, and the inverter 86 outputs the short pulse $\overline{φsp}$ of logic "low" state as shown in FIG. 7. The clock signal CK becomes the short pulse of logic "low" state, and the counting signals $LP_1$ and $LP_2$ of the binary counter 400 become the logic "low" and logic "high" states, respectively. Thus, the NOR gate 52 of FIG. 2 generates the trimming signal $TRM_{P2}$ which goes to the logic "high" state. In response to the trimming signal $TRM_{P2}$ of logic "high" state, the resistors $R_1$ and $R_2$ of FIG. 1 are bypassed, and the voltage $V_{36}$ at the connection node 36 becomes smaller than the reference voltage Vpref. Hence, the high voltage generation control circuit 20 is activated, and thereby the high voltage generator 10 generates the program voltage $V_{pgm2}$ as shown in the above equation (3).

If the selected memory cells are not successfully programmed regardless of the reprogram operation, the program operation is performed again during the time between $t_5$ and $t_6$. In the same way, with the sequential increase of the program voltage, the program and program verification operations are automatically performed until all the selected memory cells are successfully programmed.

The timing diagram of FIG. 7 shows the case that the selected memory cells are successfully programmed at the fifth program operation. After the completion of the fifth program operation, the program detection signal PDS indicating that the selected memory cells have been successfully programmed goes to the logic "high" state at the program verification operation between the time $t_{10}$ and $t_{11}$. Thereby, the control signal generator of FIG. 5 makes the program control signal $\overline{PGM}$ logic "high" state, and the circuits related to the program like a ring counter (not shown) are inactivated. After about 2.5 μsec after the program control signal $\overline{PGM}$ goes to the logic "high" state, the auto-program flag signal Sapgm becomes the logic "low" state. It is possible to detect how many program loops are occurred during the 2.5 μsec with the complementary counting signals $\overline{LP_1}$ to $\overline{LP_7}$ outputted from the binary counter 400.

Figure 8:
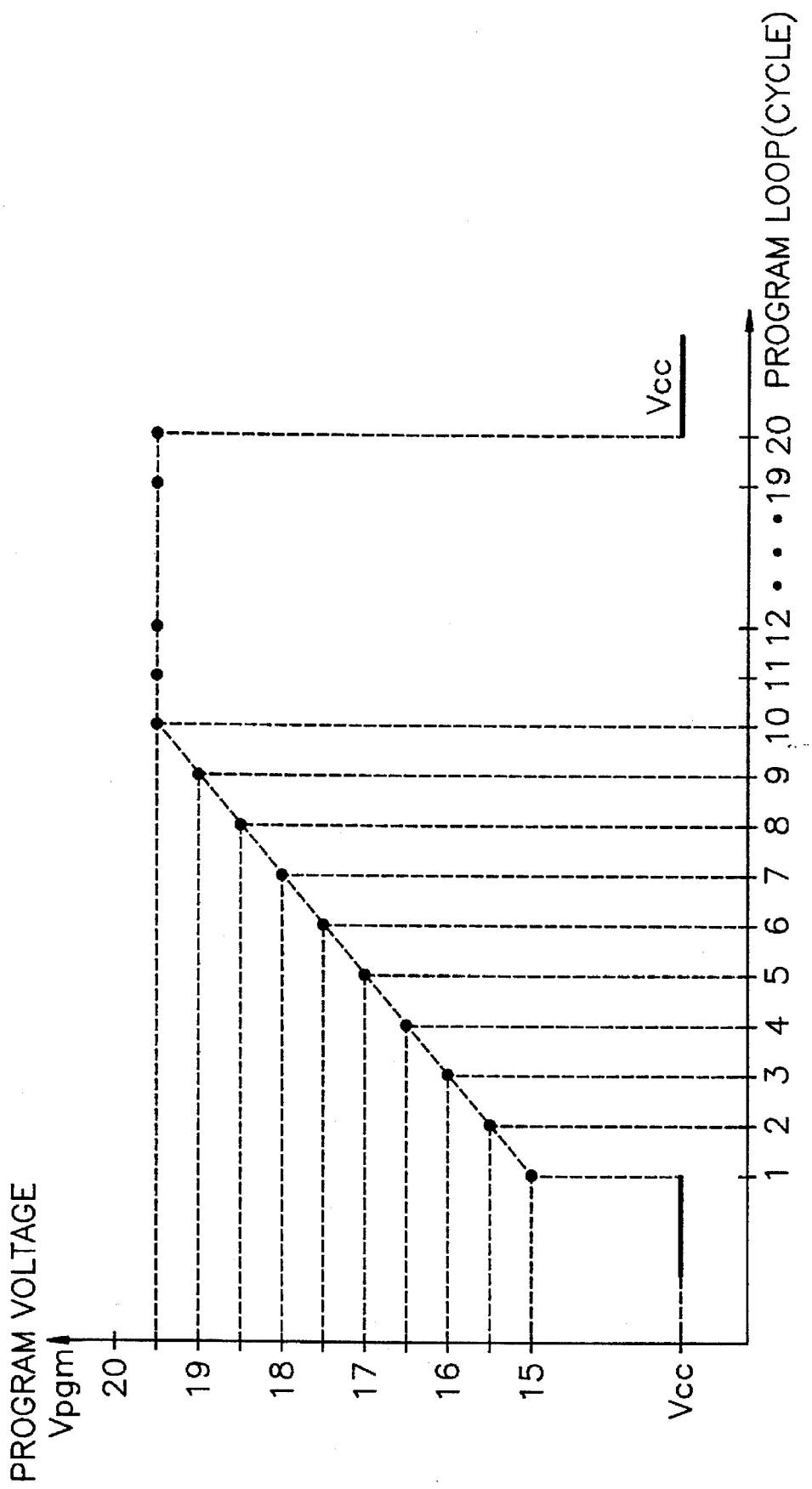
FIG. 8 is a diagram showing the relation between the program loop and the program voltage according to the preferred embodiment of the present invention.
Figure 9:
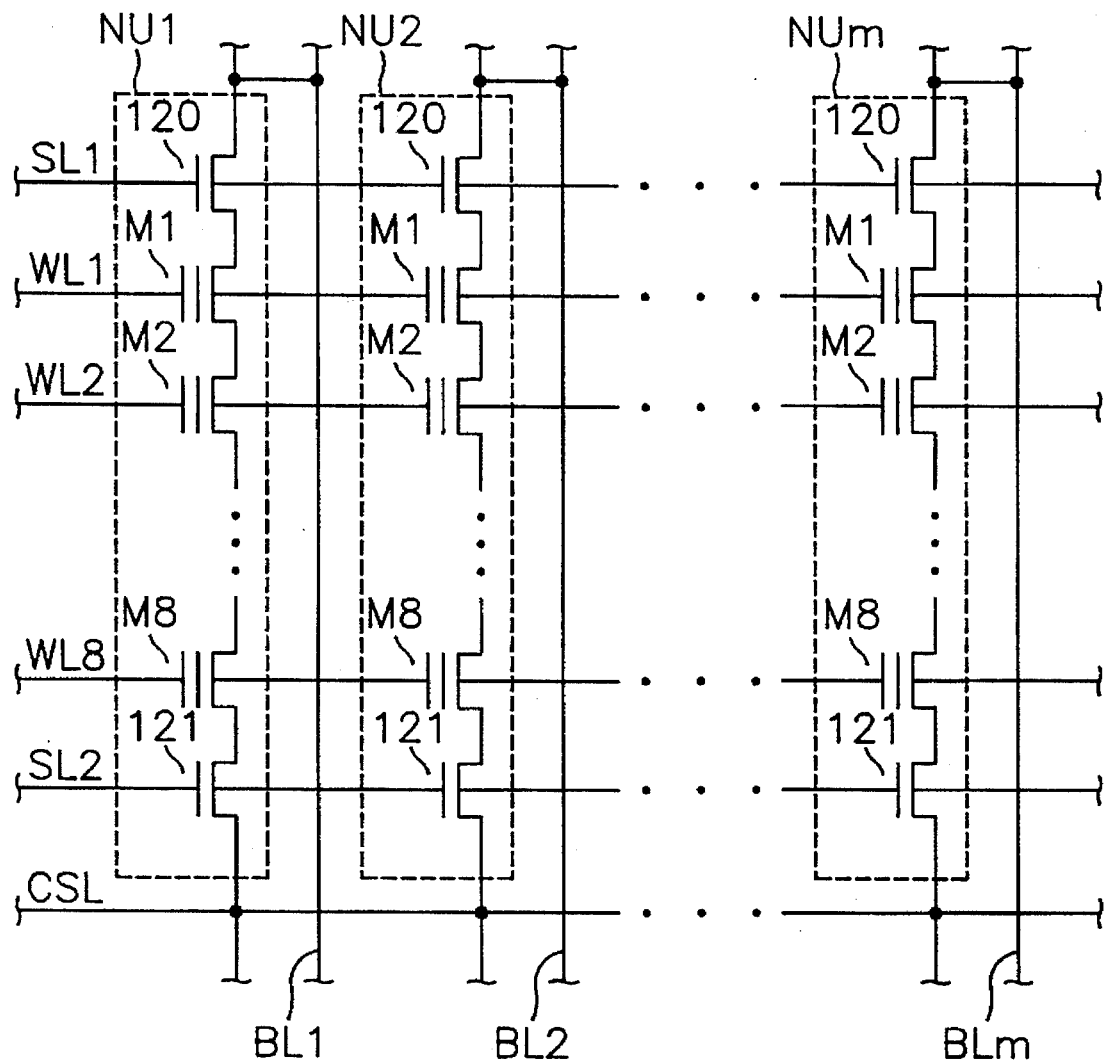
FIG. 9 is an equivalent circuit diagram showing a part of the memory cell array with conventional NAND structured memory cells.

FIG. 8 is a diagram showing the relation between the program loop and the program voltage according to the preferred embodiment of the present invention. Referring to FIG. 8, the program operations for the selected memory cells can be performed as much as 20 times. The program voltage Vpgm sequentially increases from 15 V to 19.5 V by 0.5 V until the tenth program operation. During the eleventh to twentieth program operations, the program voltage Vpgm maintains the maximum constant voltage level Vpgmmax of 19.5 V by the latch operation of the flip-flop composed of the NOR gates 56 and 57. If the selected memory cells are not successfully programmed after the twentieth program operation, the loop counting circuit 500 of FIG. 6 generates the loop counting signal PCout which goes to the logic "high" state, and thereby the control signal generator of FIG. 5 generates the program control signal $\overline{PGM}$ which goes to the logic "high" state, thus stopping the generation of the program voltage Vpgm.

As described above, the auto-program voltage generator generates the program voltage which increases sequentially within a predetermined voltage range depending on the program loop according to the present invention. The program voltage is supplied to the selected word line. However, the variance of the threshold voltage and the stress of the memory cells which should not be programmed among the memory cells connected to the selected word line should be prevented.

In the program operation of the conventional technique, the pass voltage Vpass, i.e., a constant voltage of 10 V is applied to the unselected word lines. For example, assuming that the word line WL2 is selected, the maximum program voltage Vpgmmax increased according to the program loop, i.e., 19.5 V is applied to the selected word line WL2, the memory cell M2 within the NAND cell unit NU2 should be programmed as data "0", and the memory cell M2 within the NAND cell unit NU1 should be kept as the erase state, i.e., data "1", the power supply voltage Vcc of 5 V is applied to the first selection line SL1, the constant pass voltage Vpass of 10 V to the unselected word lines WL1 and WL3 to WL8, and the ground voltage Vss to the second selection line SL2 during the program operation. At the same time, the ground voltage Vss is applied to the bit line BL2 related to the memory cell M2 which is to be programmed as the data "0" within the NAND cell unit NU2, and the power supply voltage Vcc of 5 V is applied to the bit line BL1 related to the memory cell M2 which should be in the erase state, i.e., the data "1" within the NAND cell unit NU1. Then, the first selection transistor 120 within the NAND cell unit NU2 is turned on and thereby the memory cell M2 within the NAND cell unit NU2 is programmed as the data "0". However, as the power supply voltage Vcc of 5 V is applied to the bit line BL1 connected to the NAND cell unit NU1 and to the gate of the first selection transistor 120 within the NAND cell unit NU1 and the pass voltage Vpass of 10 V is applied to the control gate of the memory cell M1 within the NAND cell unit NU1, the source of the first selection transistor 120 is charged with the pass voltage Vpass, and thereby the first selection transistor 120 is turned off. Thus, the source and drain of the memory cell M2 within the NAND cell unit NU1 are charged with the pass voltage Vpass (=10 V), and the increased program voltage of 19.5 V is abruptly applied to the control gate of the memory cell M2. Therefore, the memory cell M2 within the NAND cell unit NU1 receives the voltage stress of 9.5 V and thereby the thin tunnel oxide layer due to the variance of the manufacturing process or the intermediate insulating layer is broken down. Meanwhile, the threshold voltage of the memory cell M2 within the NAND cell unit NU2 is varied. Therefore, the application of the constant pass voltage Vpass to the unselected word lines deteriorates the reliability of the EEPROM. To solve such a problem, the preferred embodiment of the present invention will be described with reference to FIGS. 10 to 12.

Figure 10:
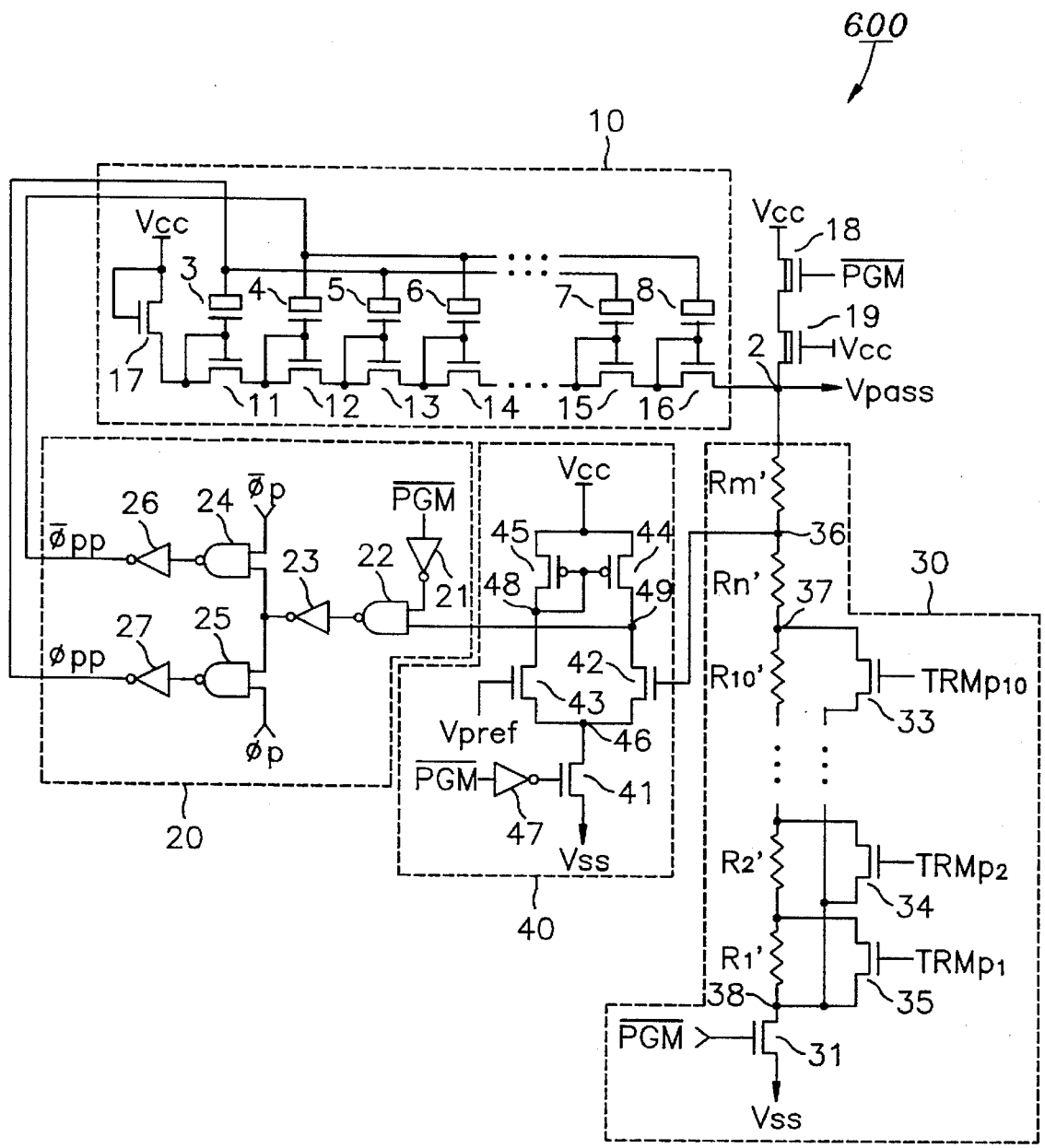
FIG. 10 is a schematic circuit diagram showing a pass voltage generator according to the preferred embodiment of the present invention.

FIG. 10 shows a pass voltage generator for generating the pass voltage to be applied to the unselected word lines. Referring to the figure, the pass voltage generator 600 has the same structure as the program voltage generator 200 of FIG. 1 except that the values of the resistors $R_1'$ to $R_{10}'$, $R_n'$ and $R_m'$ in the pass voltage generator 600 are different from those of the resistors $R_1$ to $R_{10}$, $R_n$ and $R_m$ in the program voltage generator 200, and that the pass voltage Vpass instead of the program voltage Vpgm is outputted from the output node 2. The control signal generators shown in FIGS. 2 to 6 are also employed to control the pass voltage generator 600. The pass voltage generator 600 generates the pass voltage Vpass which increases sequentially from the initial pass voltage Vpassin of 8 V to the maximum pass voltage Vpassmax of 12.5 V according to the program loop. The generation of the increasing pass voltage Vpass can be implemented by using the proper values of the resistors $R_1'$ to $R_{10}'$, $R_n$ and $R_m$. The operations of the pass voltage generator 600 are identical to those of the program voltage generator 200 except the value of the pass voltage Vpass, and such will not be described. The control signal generators shown in FIGS. 2 to 6 are employed in the pass voltage generator 600 of FIG. 10, and such will not be described, either.

Figure 11:
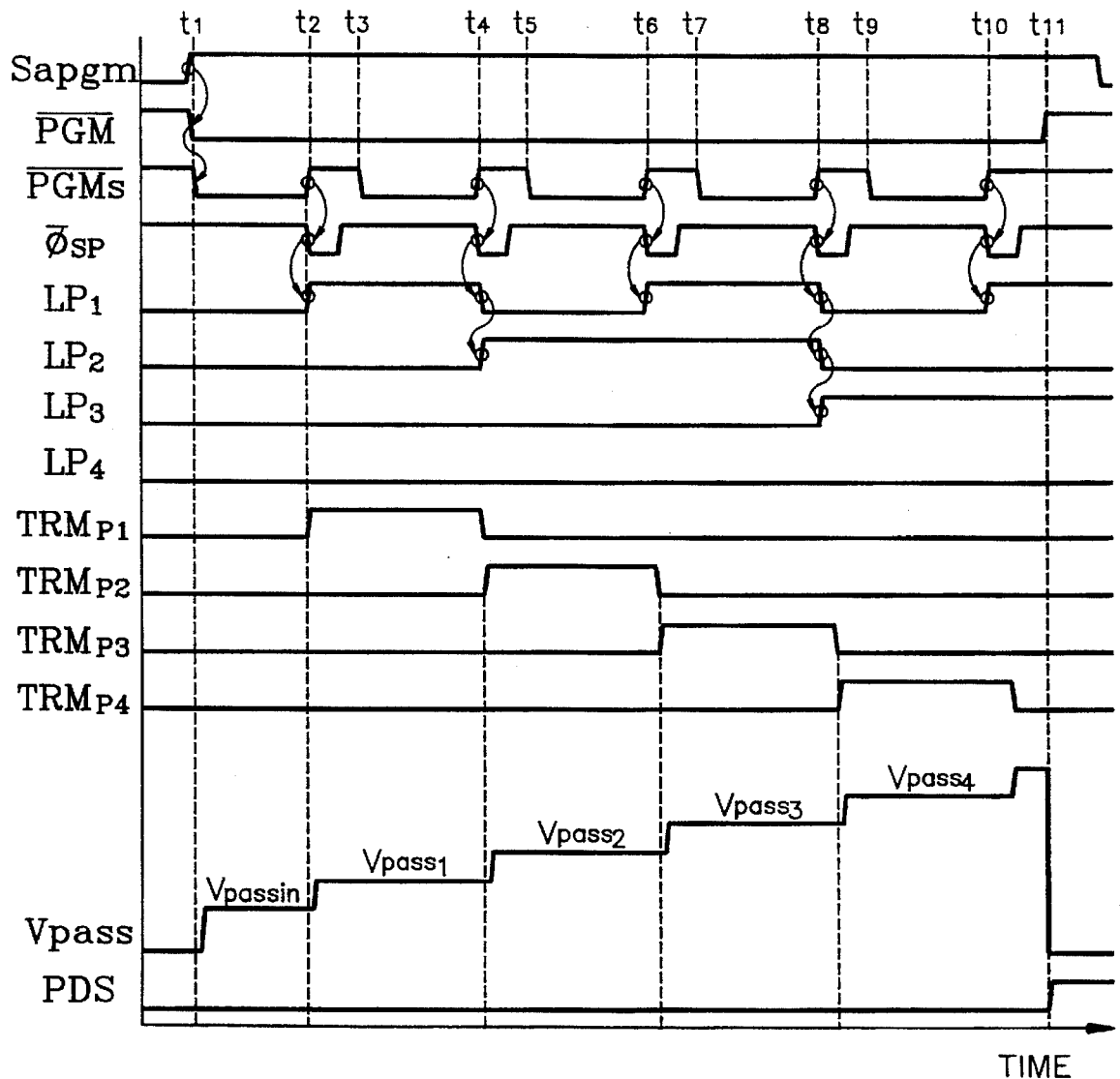
FIG. 11 is a timing diagram showing the operation of each part of the circuits related to the pass voltage generator according to the preferred embodiment of the present invention.

FIG. 11 is a timing diagram for describing the operations of the pass voltage generator of FIG. 10. FIG. 11 is identical to FIG. 7 except that the pass voltage Vpass is generated instead of the program voltage Vpgm.

Figure 12:
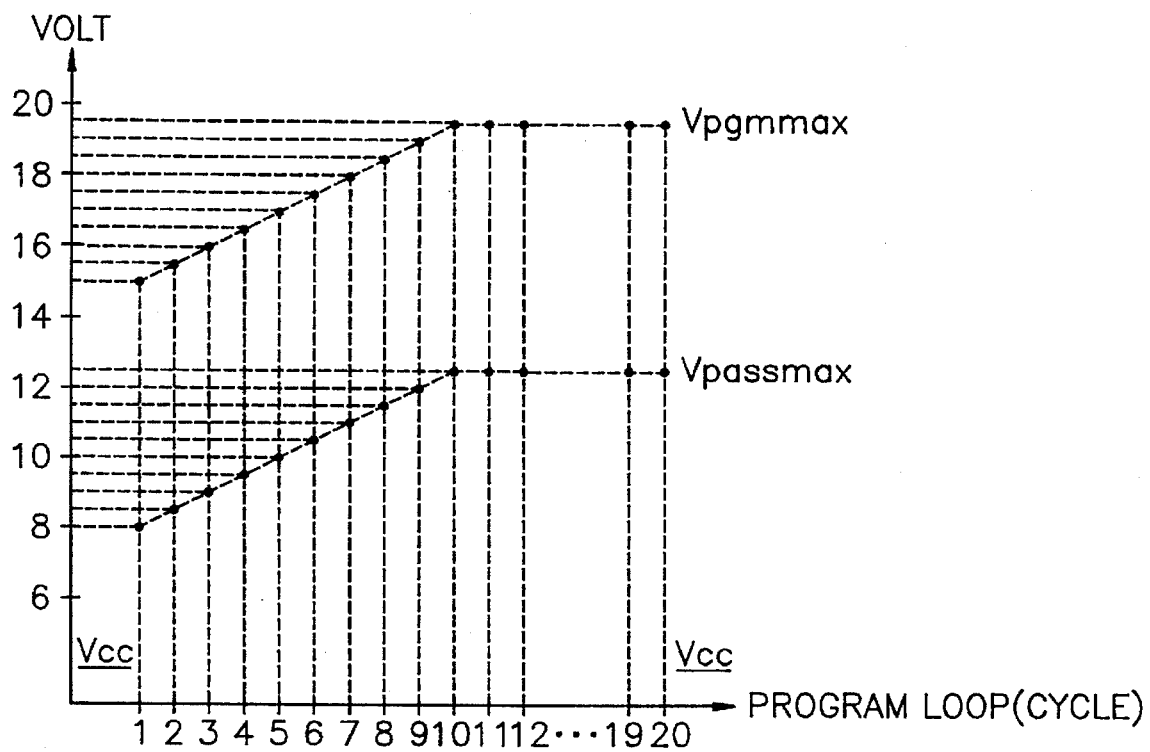
FIG. 12 is a diagram showing the relation between the program loop and the program voltage and pass voltage according to the preferred embodiment of the present invention.

FIG. 12 is a diagram showing the relation between the program voltage Vpgm and the pass voltage Vpass according to the program loop. As can be seen in the figure, the voltage difference between the program voltage Vpgm and the pass voltage Vpass maintains 5 V until the tenth program operation. Such a voltage difference can be set properly according to the structure or properties of the memory cells to prevent the insulation break down or the variance of the threshold voltage of the memory cells which should not be programmed.

As described above, since the auto-program voltage generator and the pass voltage generator according to the present invention generate the program voltage and pass voltage which increase sequentially within a predetermined voltage range, the reliability of the chip can be enhanced without the break down of the insulating layer or the variance of the threshold voltage of the memory cells which should not be programmed. In addition, it is possible to achieve a uniform threshold voltages, and to enhance the performance of the chip regardless of the change in process and the circumstance condition.

What is claimed is:

1. An auto-program voltage generator in a nonvolatile semiconductor memory having a plurality of floating gate type memory cells, program means for programming selected memory cells, and program verification means for verifying whether or not said selected memory cells are successfully programmed, said auto-program voltage generator comprising:

a high voltage generator for generating a program voltage;

a trimming circuit for causing said program voltage to increase sequentially within a predetermined voltage range every time one of said selected memory cells is not successfully programmed, said trimming circuit sequentially outputting a detected voltage level signal corresponding to said sequentially increasing program voltage;

a comparing circuit for comparing said detected voltage level signal with a reference voltage and then generating a comparing signal when said detected voltage level signal is less than said reference voltage; and a high voltage generation control circuit for activating said high voltage generator in response to said comparing signal.

2. The auto-program voltage generator according to claim 1, wherein said trimming circuit comprises a plurality of resistors serially connected between a program voltage generation terminal of said high voltage generator and a second reference voltage, and a plurality of transistors for respectively bypassing each of said plurality of resistors in order to increase sequentially said program voltage.

3. The auto-program voltage generator according to claim 1, wherein said trimming circuit comprises a plurality of bypass means to increase sequentially said program voltage.

4. The auto-program voltage generator according to claim 3, further comprising a trimming signal generator connected to said plurality of bypass means, for generating trimming signals that are respectively supplied to each of said bypass means and allow for increasing sequentially said program voltage.

5. The auto-program voltage generator according to claim 4, wherein said trimming signal generator comprises latch means for generating a constant voltage for each of said trimming signals after said program voltage has been sequentially increased.

6. The auto-program voltage generator according to claim 4, further comprising a binary counter connected to said trimming signal generator, for sequentially activating said plurality of bypass means.

7. The auto-program voltage generator according to claim 5, further comprising a binary counter connected to said trimming signal generator, for sequentially activating said plurality of bypass means.

8. The auto-program voltage generator according to claim 7, further comprising a loop counting circuit for stopping the generation of said program voltage in response to counting signals outputted from said binary counter.

9. An auto-program voltage generating method of a nonvolatile semiconductor memory which performs sequentially program and program verification operations, said sequential program using a program voltage that is sequentially increased within a predetermined voltage range and then maintained at a constant voltage level when programming a selected memory cell that is not successfully programmed.

10. The method according to claim 9, wherein said constant voltage level is set to prevent junction break down and break down of a gate oxide layer of memory cells.

11. The method according to claim 9, wherein said predetermined voltage range is from about 15 V to 19.5 V.

12. The auto-program voltage generator according to claim 1, where said sequentially increasing program voltage increases in increments that are each less than 1 volt.

13. The auto-program voltage generator according to claim 1, wherein said sequentially increasing program voltage increases in increments that are each less than 0.5 volts.

14. The method according to claim 9, where said sequentially increasing program voltage increases in increments that are each less than 1 volt.

15. The method according to claim 9, wherein said sequentially increasing program voltage increases in increments that are each less than 0.5 volts.

16. The method according to claim 11, where said sequentially increasing program voltage increases in increments that are each less than 1 volt.

17. The method according to claim 11, wherein said sequentially increasing program voltage increases in increments that are each less than 0.5 volts.

18. The auto-program voltage generator according to claim 1, wherein said memory cells are programmed in one of two states and said sequentially increasing program voltage is used to change each selected memory cell from one of said states to another of said states.

19. The method according to claim 9, wherein said memory cells are programmed in one of two states and said sequentially increasing program voltage is used to change each selected memory cell from one of said states to another of said states.

* * * * *